(12) United States Patent
Lee

(10) Patent No.: US 7,639,031 B2
(45) Date of Patent: Dec. 29, 2009

(54) TESTING ASSEMBLY FOR ELECTRIC TEST OF ELECTRIC PACKAGE AND TESTING SOCKET THEREOF

(75) Inventor: Sheng-Yuan Lee, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 178 days.

(21) Appl. No.: 11/370,305

(22) Filed: Mar. 7, 2006

(65) Prior Publication Data

US 2007/0040566 A1 Feb. 22, 2007

(30) Foreign Application Priority Data

Aug. 16, 2005 (TW) .............................. 94127839 A

(51) Int. Cl.
*G01R 1/073* (2006.01)
(52) U.S. Cl. ....................... 324/761; 324/755
(58) Field of Classification Search .......... 324/754–765
See application file for complete search history.

(56) References Cited

U.S. PATENT DOCUMENTS

| | | | |
|---|---|---|---|
| 3,274,534 A * | 9/1966 | Shortridge | 439/700 |
| 4,766,371 A * | 8/1988 | Moriya | 324/763 |
| 7,265,565 B2 * | 9/2007 | Chen et al. | 324/762 |

* cited by examiner

*Primary Examiner*—Ernest F Karlsen
(74) *Attorney, Agent, or Firm*—J.C. Patents

(57) ABSTRACT

A testing assembly for an electric package is suitable for electric testing of an electric package. The electric package has many contacts on a contact surface of the electric package. The contacts are arranged along an alignment line. The testing assembly for an electric package includes a testing board and a testing socket. The testing board has many testing pads. The testing socket is mounted on the testing board. The testing socket includes an insulating body and a plurality of pins. The insulating body has a carrying surface suitable for supporting a contact surface of the electric package. The pins passing through the insulating body are served as electric channels between the contacts and the testing pads. The pins are in contact with the contacts respectively, and the adjacent pins are arranged in a staggered way or arranged in different pitches.

8 Claims, 3 Drawing Sheets

TESTING ASSEMBLY FOR ELECTRIC TEST OF ELECTRIC PACKAGE AND TESTING SOCKET THEREOF

CROSS-REFERENCE TO RELATED APPLICATION

This application claims the priority benefit of Taiwan application serial no. 94127839, filed on Aug. 16, 2005. All disclosure of the Taiwan application is incorporated herein by reference.

BACKGROUND OF THE INVENTION

1. Field of Invention

The present invention relates to a testing assembly. More particularly, the present invention relates to a testing assembly used for electric test of electric packages.

2. Description of Related Art

Generally, after IC chips are packaged into packages, a device level testing will be performed to the packages to eliminate unqualified ones and to ensure the quality thereof. Moreover, to ensure that a package can work properly after it is installed into a computer system, a system level testing may be performed to the packages. These tests are necessary for packages of advanced or costly IC chips.

The testing assemblies of packages may vary by the package forms of packages. As to quad flat no-lead (QFN) packages, the testing assembly thereof includes a testing board and a testing socket, wherein the testing socket is installed on the testing board. The testing socket includes an insulating body and a plurality of pogo-pins, wherein the pogo-pins pass though the insulating body and the pogo-pins are arranged according to the electrodes of the QFN package to be tested. In addition, part of the surface of the testing board corresponding to the testing socket has a plurality of testing pads, and the bottom ends of the pogo-pins are in touch with the testing pads respectively and elastically.

When a QFN package is installed on the testing socket and a contact surface of the QFN package touches a carrying surface of the insulating body, the top ends of the pogo-pins will be in touch with the electrodes on the contact surface of the QFN package respectively so these pogo-pins are served as electric channels between the electrodes of the QFN package and the testing pads of the testing board respectively. Accordingly, the QFN package may be electrically connected to the testing board through the testing socket so that electric test may be performed to the QFN package.

However, as to the conventional testing socket corresponding to the electric test for QFN packages, along with the increase of electrode density of the QFN package, the space between the pogo-pins of the conventional testing socket will be too narrow as to the size of the pogo-pins, thus capacitive coupling between adjacent pogo-pins will increase, which will further worsen the impedance mismatch and decrease the quality of signal transmission. All of these are very disadvantageous to the testing accuracy of testing assemblies as a whole.

SUMMARY OF THE INVENTION

The present invention provides a testing assembly used for electric test of an electric package. One example of the present invention includes a plurality of contacts on a contact surface of the electric package, wherein the contacts are arranged along an alignment line. The testing assembly includes a testing board and a testing socket. The testing board has a plurality of testing pads. The testing socket including an insulating body and a plurality of pins is disposed on the testing board. The insulating body has a carrying surface used for supporting the contact surface of the electric package. A plurality of pins passes through the insulating body served as electric channels between the contacts and the testing pads respectively, wherein the pins are in touch with the contacts respectively, and at least three adjacent pins are arranged in a staggered way.

The example of the present invention also provides a testing socket disposed on a testing board to be used for electric test of an electric package, wherein the testing board has a plurality of testing pads and the electric package has a plurality of contacts on a contact surface of the electric package, and these contacts are arranged along an alignment line. The testing socket includes an insulating body and a plurality of pins. The insulating body has a carrying surface for supporting the contact surface of the electric package. A plurality of pins passes through the insulating body served as electric channels between the contacts and the testing pads. The pins are in touch with the contacts respectively, and at least three adjacent pins are arranged in a staggered way along an alignment line.

Another example of the present invention provides a testing socket disposed on a testing board to be used for electric test of an electric package, wherein the testing board has a plurality of testing pads, and the electric package has a plurality of contacts on a contact surface of the electric package, and these contacts are arranged along an alignment line. The testing socket includes an insulating body and a plurality of pins. The insulating body has a carrying surface for supporting the contact surface of the electric package. A plurality of pins passes through the insulating body served as electric channels between the contacts and the testing pads, wherein the pins are in touch with the contacts respectively, and the distance between at least two adjacent pins is greater than the distance between any two adjacent contacts.

According to an embodiment of the present invention, the distance between at least two adjacent pins among the aforementioned pins is greater than or equal to the sum of the distance between any two adjacent contacts and ⅙ of the width of the contacts along the alignment line.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
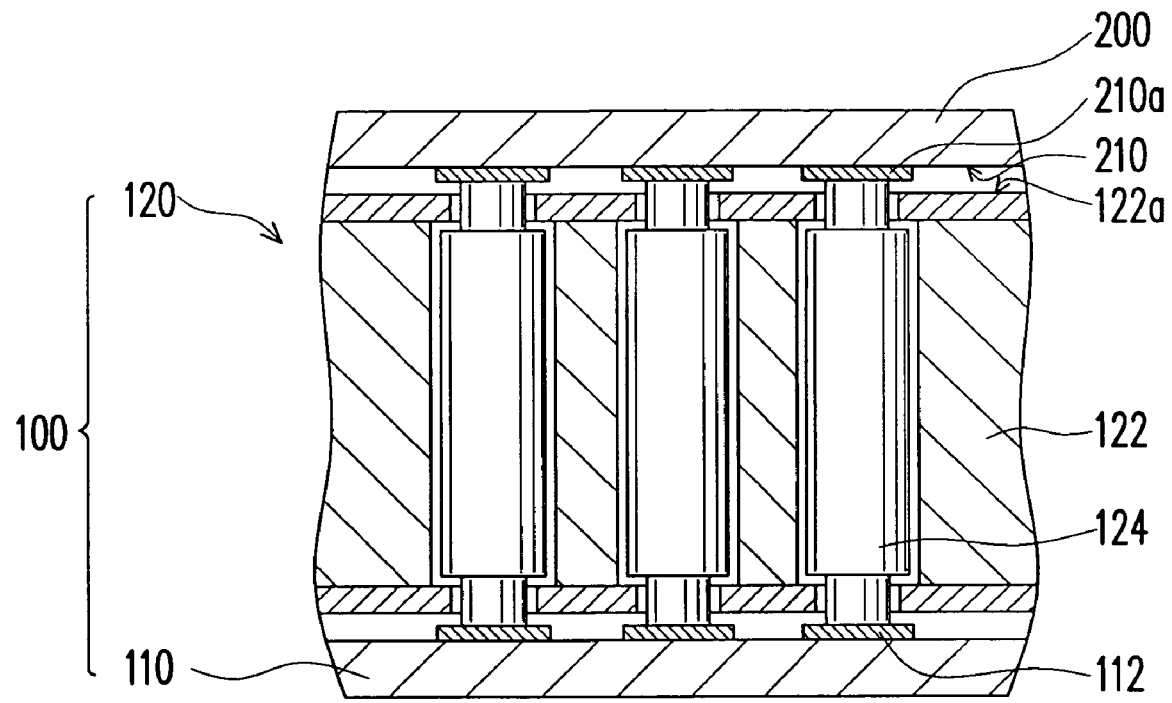
FIG. 1 is a side view illustrating the assembled structure of a testing assembly and an electric package according to the first embodiment of the present invention.

Referring to FIG. 1, which is a side view illustrating the assembled structure of a testing assembly and an electric package according to the first embodiment of the present invention. The testing assembly 100 is suitable for electric test of an electric package 200 (e.g. a QFN package) having a contact surface 210 and a plurality of contacts 210a disposed on the contact surface 210.

The testing assembly 100 includes a testing board 110 and a testing socket 120. The testing board 110 has a plurality of testing pads 112. In addition, the testing socket 120 is disposed on the testing board 110 in a fixed or removable manner. The testing socket 120 includes an insulating body 122 and a plurality of pins 124. The insulating body 122 has a carrying surface 122a for supporting the contact surface 210 of the electric package 200. A plurality of pins 124 passes through the insulating body 122 served as electric channels between the contacts 210a and the testing pads 112, wherein the pins 124 are in touch with the contacts 210a, respectively.

When the electric package 200 is installed on the testing socket 120 and the contact surface 210 of the electric package 200 faces the carrying surface 122a of the insulating body 122, the top ends of the pins 124 will be in touch with the contacts 210a on the contact surface 210 of the electric package 200 so as to electrically connect between the contacts 210a and the testing pads 112; that is, these pins 124 are served as the electric channels between the electric package 200 and the testing board 110. Accordingly, the electric package 200 may be electrically connected to the testing board 110 through the testing socket 120 so that electric test may be performed to the electric package 200 through the testing board 110. It is noticeable that, the pins 124 in the insulating body 122 may be pogo-pins which may be flexible with respect to the pressure they received so it can be ensured that all of the top ends of the pins 124 are in touch with the contacts 210a on the contact surface 210 of the electric package 200.

Figure 2:
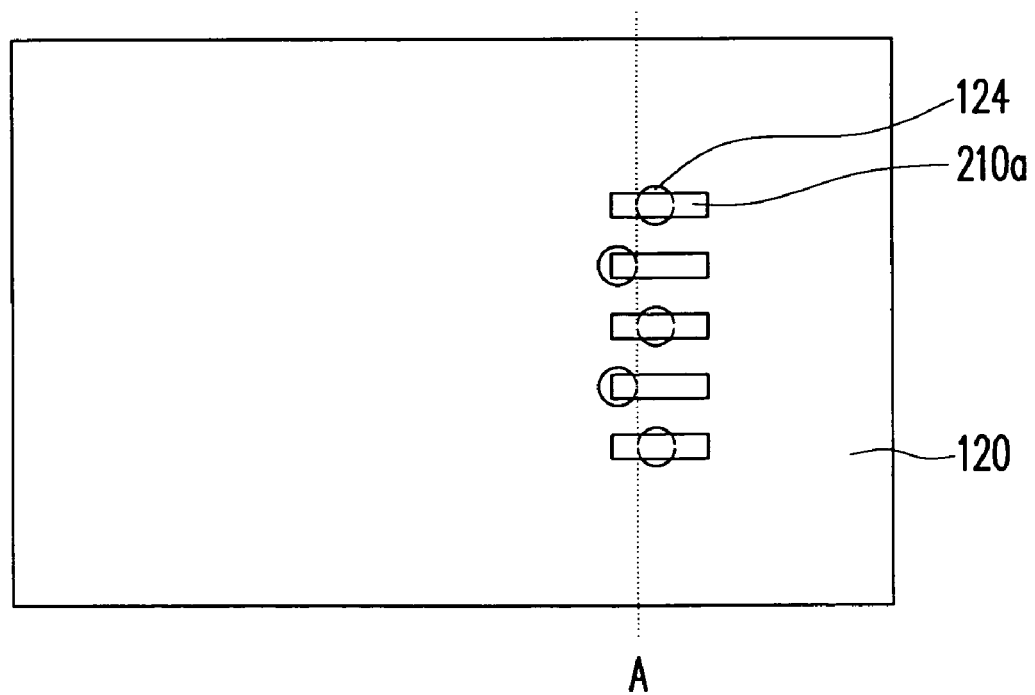
FIG. 2 is a top view illustrating partial components in FIG. 1.

Referring to both FIGS. 1 and 2, wherein FIG. 2 is a top view illustrating partial components in FIG. 1. To show the relative positions between the contacts 210a of the electric package 200 and the pins 124 of the testing socket 120, as to the electric package 200 in FIG. 1, FIG. 2 only illustrates part of the contacts 210a of the electric package 200. Similarly, as to the testing socket 120 in FIG. 1, FIG. 2 only illustrates part of the pins 124 of the testing socket 120. It can be understood from FIG. 2 that the contacts 210a of the electric package 200 are arranged along an alignment line A; and at least three adjacent pins among the pins 124 of the testing socket 120 are arranged in a staggered way along the alignment line A, or all the pins 124 are arranged in a staggered way along the alignment line A.

Figure 3:
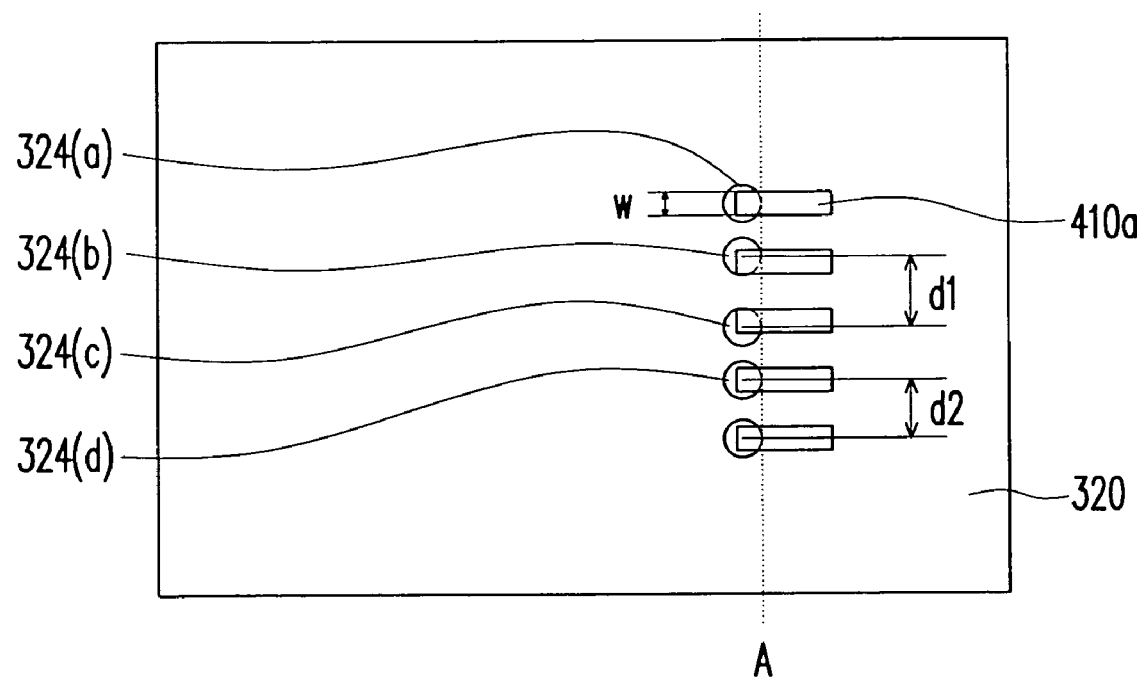
FIG. 3 is a top view illustrating partial components of the assembled structure of a testing assembly and an electric package according to the second embodiment of the present invention.

Referring to FIG. 3, which is a top view illustrating partial components of the assembled structure of a testing assembly and an electric package according to the second embodiment of the present invention. To show the relative position between the contacts 410a of the electric package and the pins 324 of the testing socket 320, FIG. 3 only illustrates part of the contacts 410a of the electric package and part of the pins 324 of the testing socket 320. It can be understood from FIG. 3 that the difference between the second embodiment and the first embodiment in FIG. 2 is the arrangement of the pins. More particularly, the pins 324 are arranged along an alignment line A as the contacts 410a in FIG. 3, and the distance d1 between at least two adjacent pins 324 is greater than the distance d2 between any two adjacent contacts 410a. The relation between distance d1 and d2 is that d1 is greater than or equal to the sum of distance d1 and ⅙ of the width w of the contacts 410a along the alignment line A, the mathematical expression thereof is $d1 \geq d2 + (w/6)$.

Furthermore, in the second embodiment, the pins 324 may be divided further into control pins 324a and 324d and signal pins 324b and 324c. As described above, the increase of the distance d1 between the pins 324b and 324c may reduce the capacitive coupling between the signal pins. Moreover, though the distance between the pins 324a and 324b and the distance between the pins 324c and 324d decrease accordingly, the capacitive coupling between the signal pins and the control pins is weak because the control pins (i.e. pin 324a and 324d) carry low frequency signals and the frequency thereof is lower than the frequency carried by the signal pins (i.e. pin 324a and 324d). It is noticeable that one of the pins 324b and 324c may be used as a power pin or a ground pin, and the pins 324a and 324d may be used as floating pins.

Figure 4:
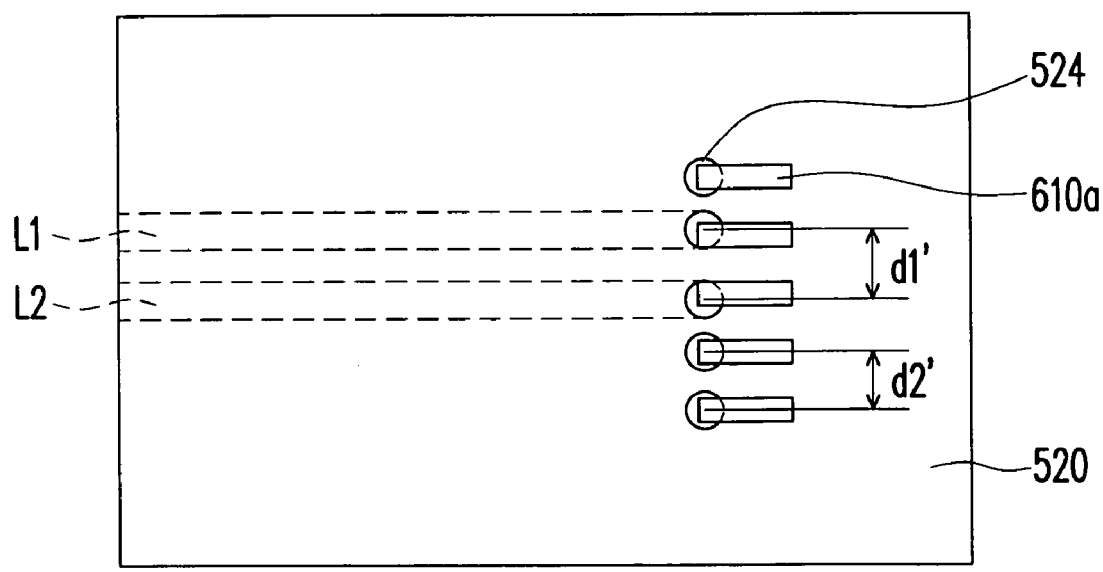
FIG. 4 is a top view illustrating partial components of the assembled structure of a testing assembly and an electric package according to the third embodiment of the present invention.

Referring to FIG. 4, which is a top view illustrating partial components of the assembled structure of a testing assembly and an electric package according to the third embodiment of the present invention. To show the relative position between the contacts 610a of the electric package and the pins 524 of the testing socket 520, FIG. 4 only illustrates part of the contacts 610a of the electric package and part of the pins 524 of the testing socket 520. It can be understood from FIG. 4 that the difference between the third embodiment and the second embodiment in FIG. 3 is that there is a differential pair signal alignment lines L1 and L2 on the testing board in FIG. 4. Thus, the arrangement of the pins 524 which are in contact with the differential pair signal alignment lines L1 and L2 in the third embodiment should use the arrangement of the second embodiment, i.e. the distance d1' between the pins 524 in contact with the differential pair signal alignment lines L1 and L2 is greater than the distance d2' between any two adjacent contacts 610a, and the relation between distance d1' and d2' is as described in the second embodiment.

Figure 5:
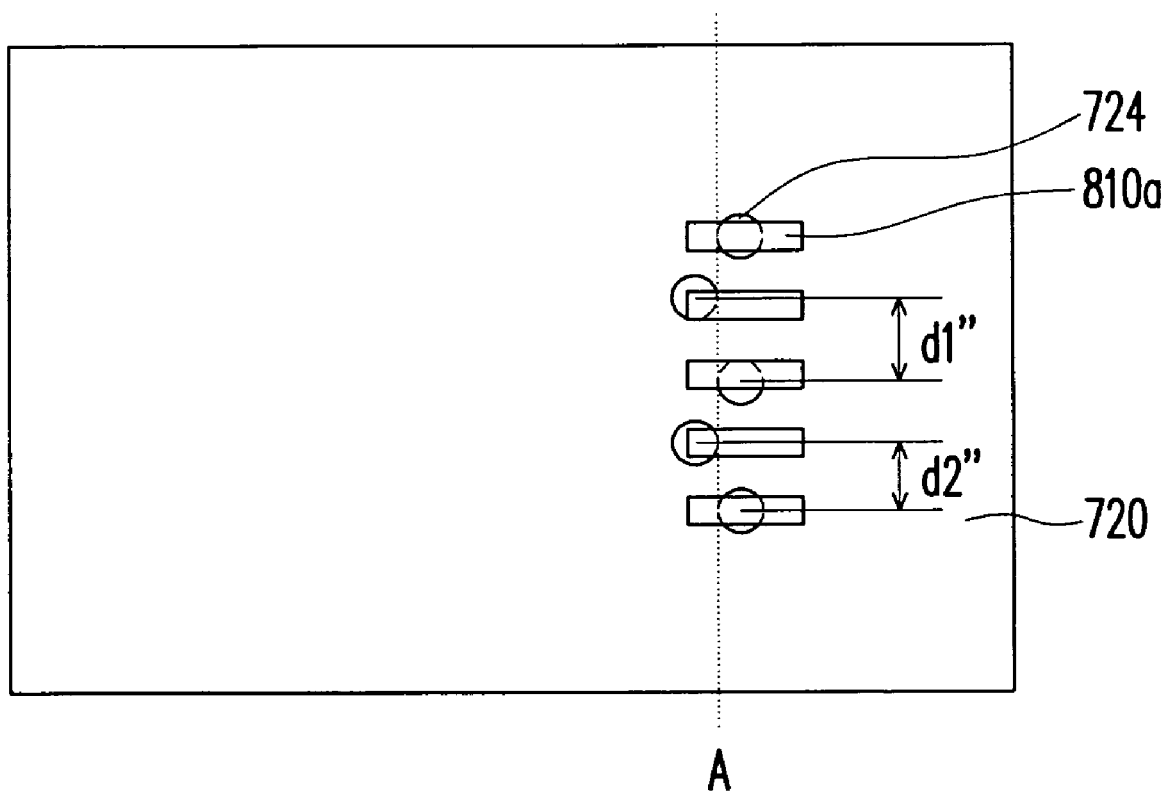
FIG. 5 is a top view illustrating partial components of the assembled structure of a testing assembly and an electric package according to the fourth embodiment of the present invention.

Referring to FIG. 5, which is a top view illustrating partial components of the assembled structure of a testing assembly and an electric package according to the fourth embodiment of the present invention. To show the relative position between the contacts 810a of the electric package and the pins 724 of the testing socket 720, FIG. 5 only illustrates part of the contacts 810a of the electric package and part of the pins 724 of the testing socket 720. It can be understood from FIG. 5 that the fourth embodiment is the combination of the first embodiment and the second embodiment. The contacts 810a are arranged along an alignment line A, and at least three adjacent pins among the pins 724 are arranged in a staggered way along the alignment line A, or all of the pins 724 are arranged in a staggered way along the alignment line A. In addition, the distance d1" between at least two adjacent pins 724 is greater than the distance d2" between any two adjacent contacts 810a, and the relation between distance d1" and d2" is as described in the second embodiment.

In overview, by changing the arrangement of the positions of the pins in the testing socket, the present invention decreases the capacitive coupling between at least two adjacent pins (e.g. especially between two signal pins carrying high frequency signals), furthermore, provides better impedance matched, and improves the quality of signal transmission. Accordingly, the accuracy of electric test for electric packages is improved. Moreover, since it does not require reducing the size of the pins to comply with the design of high density electric packages, but only to slightly adjust the positions of the pins in the testing sockets when fabricating the testing sockets, the present invention can reduce production cost of testing sockets.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A testing assembly used for electric test of an electric package having a plurality of contacts on a contact surface of the electric package, the testing assembly includes:
   a testing board having a plurality of testing pads; and
   a testing socket disposed on the testing board, comprising:
   an insulating body having a carrying surface for supporting the contact surface of the electric package; and
   a plurality of pins passing through the insulating body, each of the pins served as an electric channel between one of the contacts and one of the testing pads, each of the contacts only connected to one of the testing pads through single pin, wherein ends of the pins are directly in touch with the testing pads and the contacts respectively, the pins are arranged along an alignment line, and at least three adjacent pins are arranged in a staggered way along the alignment line.

2. The testing assembly as claimed in claim 1, wherein the distance between projections of at least two adjacent pins on the alignment line is greater than the distance between projections of two adjacent pins of the remainder of the pins on the alignment line.

3. The testing assembly as claimed in claim 1, wherein the pins are all arranged in a staggered way along the alignment line.

4. The testing assembly as claimed in claim 1, wherein the pins are flexible pins.

5. A testing socket disposed on a testing board to be used for electric test of an electric package, wherein the testing board has a plurality of testing pads and the electric package has a plurality of contacts on a contact surface of the electric package, the testing socket includes:
   an insulating body having a carrying surface for supporting the contact surface of the electric package; and
   a plurality of pins passing through the insulating body, each of the pins served as an electric channel between one of the contacts and one of the testing pads, each of the contacts only connected to one of the testing pads through single pin, wherein ends of the pins are directly in touch with the testing pads and the contacts respectively, the pins are arranged along an alignment line, and at least three adjacent pins are arranged in a staggered way along the alignment line.

6. The testing socket as claimed in claim 5, wherein the distance between projections of at least two adjacent pins on the alignment line is greater than the distance between projections of two adjacent pins of the remainder of the pins on the alignment line.

7. The testing socket as claimed in claim 5, wherein the pins are all arranged in a staggered way along the alignment line.

8. The testing socket as claimed in claim 5, wherein the pins are flexible pins.

* * * * *